(12) United States Patent
Moore et al.

(10) Patent No.: US 7,050,319 B2
(45) Date of Patent: May 23, 2006

(54) MEMORY ARCHITECTURE AND METHOD OF MANUFACTURE AND OPERATION THEREOF

(75) Inventors: John T. Moore, Boise, ID (US); Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 176 days.

(21) Appl. No.: 10/725,557

(22) Filed: Dec. 3, 2003

(65) Prior Publication Data

US 2005/0122757 A1 Jun. 9, 2005

(51) Int. Cl.
*G11C 5/06* (2006.01)
(52) U.S. Cl. ............... 365/63; 365/153; 365/182
(58) Field of Classification Search ............ 365/63, 365/153, 182
See application file for complete search history.

(56) References Cited

U.S. PATENT DOCUMENTS

| | | | |
|---|---|---|---|
| 5,314,772 A | 5/1994 | Kozicki | |
| 5,500,532 A | 3/1996 | Kozicki et al. | |
| 5,761,115 A | 6/1998 | Kozicki et al. | |
| 5,896,312 A | 4/1999 | Kozicki et al. | |
| 5,914,893 A | 6/1999 | Kozicki et al. | |
| 6,084,796 A | 7/2000 | Kozicki et al. | |
| 6,388,324 B1 | 5/2002 | Kozicki et al. | |
| 6,418,049 B1 | 7/2002 | Kozicki et al. | |
| 6,469,364 B1 | 10/2002 | Kozicki | |
| 6,487,106 B1 | 11/2002 | Kozicki | |
| 6,504,123 B1 | 1/2003 | Beffa | |
| 6,529,793 B1 | 3/2003 | Beffa | |
| 6,594,611 B1 | 7/2003 | Beffa | |
| 6,847,543 B1 * | 1/2005 | Toyoda et al. ............ 365/154 |
| 2002/0000666 A1 | 1/2002 | Kozicki et al. | |
| 2002/0168820 A1 | 11/2002 | Kozicki | |
| 2002/0168852 A1 | 11/2002 | Kozicki | |
| 2002/0190350 A1 | 12/2002 | Kozicki et al. | |
| 2003/0035314 A1 | 2/2003 | Kozicki | |
| 2003/0035315 A1 | 2/2003 | Kozicki | |
| 2003/0048519 A1 | 3/2003 | Kozicki | |
| 2003/0107105 A1 | 6/2003 | Kozicki | |

(Continued)

OTHER PUBLICATIONS

Kozicki et al., Silver incorporation in thin films of selenium rich Ge-Se glasses, International Congress on Glass, vol. 2, Extended Abstracts, Jul. 2001, pp. 8-9.
Michael N. Kozicki, 1. Programmable Metallization Cell Technology Description, Feb. 18, 2000.

(Continued)

*Primary Examiner*—Tuan T. Nguyen
(74) *Attorney, Agent, or Firm*—Dickstein Shapiro Morin & Oshinsky LLP

(57) ABSTRACT

An architecture, and its method of formation and operation, containing a high density memory array of semi-volatile or non-volatile memory elements, including, but not limited to, programmable conductive access memory elements. The architecture in one exemplary embodiment has a pair of semi-volatile or non-volatile memory elements which selectively share a bit line through respective first electrodes and access transistors controlled by respective word lines. The memory elements each have a respective second electrode coupled thereto which in cooperation with the bit line access transistors and first electrode, serves to apply read, write and erase signals to the memory element.

27 Claims, 14 Drawing Sheets

U.S. PATENT DOCUMENTS

| | | | |
|---|---|---|---|
| 2003/0137869 A1 | 7/2003 | Kozicki | |
| 2003/0156447 A1 | 8/2003 | Kozicki | |
| 2003/0209728 A1 | 11/2003 | Kozicki et al. | |
| 2003/0209971 A1 | 11/2003 | Kozicki et al. | |
| 2003/0210564 A1 | 11/2003 | Kozicki et al. | |
| 2004/0114444 A1* | 6/2004 | Matsuoka | 365/200 |
| 2004/0233726 A1* | 11/2004 | Iwase et al. | 365/185.22 |
| 2005/0151277 A1* | 7/2005 | Kawazoe et al. | 257/904 |

OTHER PUBLICATIONS

Michael N. Kozicki, Axon Technologies Corp. and Arizona State University, Presentation to Micron Technology, Inc., Apr. 6, 2000.

Kozicki et al., Applications of Programmable Resistance Changes In Metal-Doped Chalcogenides, Electrochemical Society Proceedings, vol. 99-13, 1999, pp. 298-309.

Kozicki et al., Nanoscale effects in devices based on chalcogenide solid solutions, Superlattices and Microstructures, vol. 27, No. 516, 2000, pp. 485-488.

Kozicki et al., Nanoscale phase separation in Ag-Ge-Se glasses, Microelectronic Engineering 63 (2002) pp. 155-159.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Mitkova, M.; Wang, Y.; Boolchand, P., Dual chemical role of Ag as an additive in chalcogenide glasses, Phys. Rev. Lett. 83 (1999) 3848-3851.

West, W.C.; Sieradzki, K; Kardynal, B.; Kozicki, M.N., Equivalent circuit modeling of the Ag?As0.24S0.36Ag0.40?Ag System prepared by photodissolution of Ag, J. Electrochem. Soc. 145 (1998) 2971-2974.

* cited by examiner

MEMORY ARCHITECTURE AND METHOD OF MANUFACTURE AND OPERATION THEREOF

FIELD OF THE INVENTION

The invention relates to the field of electronic device structures, and in particular to an improved memory device architecture, and its method of manufacture and operation.

BACKGROUND OF THE INVENTION

Desirable characteristics of a memory device include high storage density, low power consumption (during all modes of operation including reading, writing, and erasure), non-volatility (i.e., persistence of data without applied power), high long-term data integrity, rapid writing and erasure of data, and rapid addressing and reading of stored data. A variety of existing memory devices exhibit these characteristics in various respective measures. Devices are typically chosen for a particular application based on the requirements of the application. For example, where long-term data storage is required in a portable device (i.e., a device supplied by battery power), a non-volatile memory may be chosen.

Most non-volatile memories are relatively slow, as compared with volatile memories. Consequently, when rapid data storage and retrieval is required volatile memories may be applied. In some systems requiring both long-term data storage and rapid data transfer in a portable device, combinations of volatile and non-volatile memories are necessary. Such combinations tend to increase price, size, and power consumption of the target system.

Recently, variable resistance memory devices have been investigated as a way of providing a semi-volatile or non-volatile memory device. A non-volatile memory device requires no refreshing operations to maintain status, while a semi-volatile memory device requires refreshing, but at intervals that are much longer than the refresh intervals typically used for Dynamic Random Access Memory (DRAM) devices. For example, a semi-volatile memory device may need to have its memory elements refreshed every few minutes, hours or even days. Chalcogenide materials having the formula $Ge_xSe_{100-x}$ may be formed into semi-volatile resistance variable memory elements.

Memory elements based on $Ge_xSe_{100-x}$ backbone material are disclosed in U.S. application Ser. No. 09/941,544, filed on Aug. 30, 2001 and Ser. No. 10/225,190, filed on Aug. 22, 2002, assigned to Micron Technology, Inc., the disclosures of which are incorporated herein by reference. Such memory elements are also known as programmable conductive random access memory (PCRAM) elements.

Generally, a programmable conductive memory element includes an initially insulating dielectric material formed of a chalcogenide glass, e.g., $Ge_xSe_{100-x}$, disposed between two electrodes. A conductive material, such as silver, is incorporated into the dielectric material. The resistance of the dielectric material can be changed between high resistance and low resistance states. The memory is normally initially in a high resistance state. A write operation to a low resistance state is performed by applying an electrical potential across the two electrodes.

When set in a low resistance state, the state of the memory element will remain intact for minutes or longer after the electrical potentials is removed. The elements can be returned to their high resistance state by applying a different electrical potential between the electrodes than the potential used to write the element to the low resistance state. Again, the highly resistive state is maintained once the electrical potential is removed. Thus, the PCRAM element can function, for example, as a resistance variable memory element having two resistance states, which can be used to define two logic states.

As with any memory device, the areal storage density of the device using programmable conductive memory elements affects device cost, system size, power consumption, operating speed, and other factors. Accordingly it is desirable to produce a memory device employing such memory elements having a high areal data storage density.

BRIEF SUMMARY OF THE INVENTION

Various exemplary embodiments of the invention are directed to a memory architecture, and its method of formation and operation, containing a high density memory array of semi-volatile or non-volatile memory elements, including, but not limited to, programmable conductive random access memory elements. The architecture in one exemplary embodiment has a pair of semi-volatile or non-volatile memory elements that selectively share a bit line through respective first electrodes and access transistors controlled by respective word lines. The memory elements each have a respective second electrode coupled thereto which, in cooperation with the bit line access transistors and first electrode, serves to apply read, write and erase signals to the memory element.

The bit lines are divided into two interleaved groups that access the memory array with the word lines being arranged below and orthogonal to the bit lines. Each pair of memory elements is positioned at a level of the device above respective access transistors and associated word lines, and above the level of interleaved bit lines in a top down spatial area defined by adjacent electrodes and adjacent bit lines.

The first and second electrodes for the memory elements are arranged two per level along the bit lines. The second electrodes also run orthogonal to the bit lines. One exemplary embodiment of the memory element comprises a chalcogenide backbone layer of $Ge_xSe_{100-x}$, where x is 40 in contact with a layer of $Ag_2Se$ with the second electrode being in electrical communication with the layer of $Ag_2Se$ and the first electrode being in electrical communication with the chalcogenide backbone layer.

BRIEF DESCRIPTION OF THE DRAWINGS

These and other features of the various embodiments of the invention will be more clearly indicated from the following detailed description which is provided in conjunction with the following drawings, in which.

DETAILED DESCRIPTION OF THE INVENTION

In the following detailed description, reference is made to various exemplary structural and process embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to a semiconductor substrate that has an exposed substrate surface. Semiconductor substrates should be understood to include silicon, silicon-on-insulator (SOI), silicon-on-sapphire (SOS), doped and undoped semiconductors, epitaxial layers of silicon supported by a base semiconductor foundation, and other semiconductor structures. When reference is made to a substrate or wafer in the following description, previous process steps may have been utilized to form regions or junctions in or over the base semiconductor or foundation.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged.

The term "silver-selenide" is intended to include various species of silver-selenide, including some species which have a slight excess or deficit of silver, for instance, $Ag_2Se$, $Ag_{2+x}Se$, and $Ag_{2-x}Se$.

The term "resistance variable memory element" is intended to include any memory element which exhibits a resistance change in response to an applied voltage. Exemplary resistance variable memory elements include, but are not limited to, programmable conductive random access memory devices (PCRAM).

The present invention relates to a memory device containing one or more arrays of resistance variable memory elements and to processes for forming and operating the same. The invention is now explained with reference to FIGS. 1–13, which illustrate exemplary embodiments of the invention.

Figure 1:
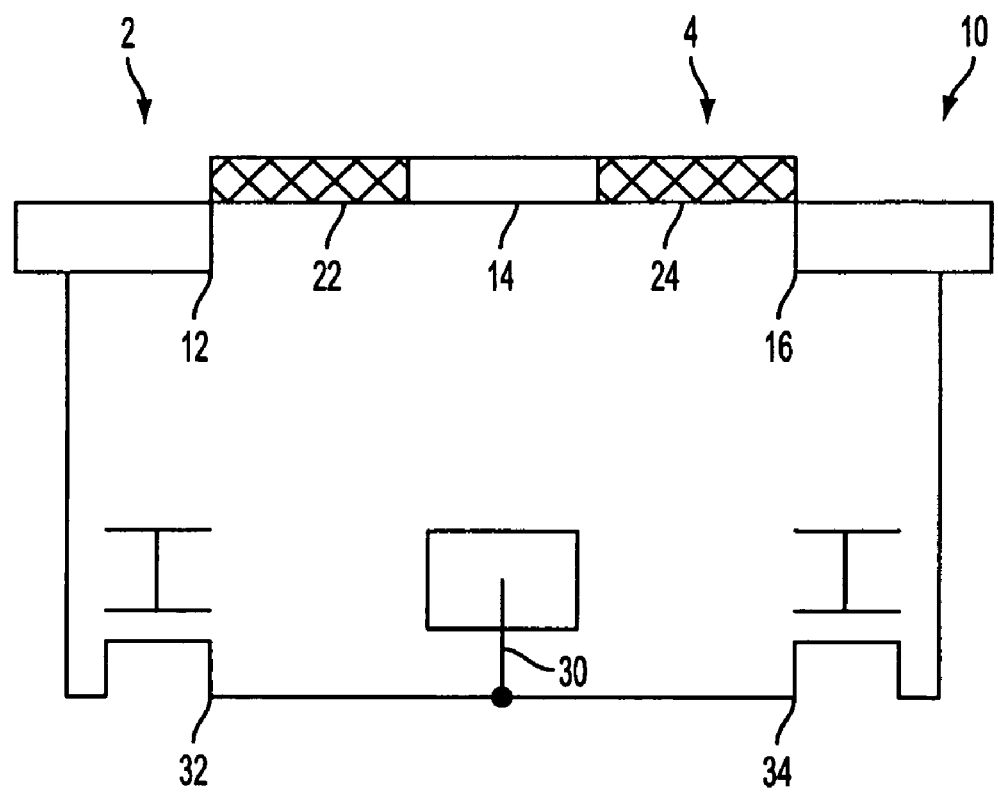
FIG. 1 is a schematic representation of a dual memory architecture according to an exemplary embodiment of the invention.

FIG. 1 shows a schematic representation of a dual memory cell 10 architecture according to one exemplary embodiment of the invention. Three electrodes 12, 14, 16 are disposed in spaced relation to one another. That is, a central electrode 14 is disposed between a first electrode 12 and a second electrode 16. A resistance variable material 22 is disposed between the first electrode 12 and the central electrode 14 forming a first memory element 2. A resistance variable material 24 is disposed between the second electrode 16 and the central electrode 14 forming a second memory element 4. The first memory element 2 changes its physical characteristics in response to, for example, an electrical potential applied between the first electrode 12 and the central electrode 14. Likewise, the second memory element 4 changes its physical characteristics in response to, for example, an electrical potential applied between the second electrode 16 and the central electrode 14.

A bit line 30 is disposed in spaced relation below the central electrode 14. The bit line 30 conveys to the memory cell 10 a voltage that may be switchingly applied to the first and the second electrodes 12, 16. A first access transistor 32 has a drain coupled to the bit line 30 and a source coupled to the first electrode 12. A second access transistor 34 has a drain coupled to the bit line 30 and a source coupled to the second electrode 16. According to one aspect of the invention, the transistors 32, 34 are disposed beneath the bit line 30, and beneath the electrodes 12, 14, 16. The first and second transistors 32, 34 each have a gate adapted to control the conductivity of the respective transistor.

Figure 2:
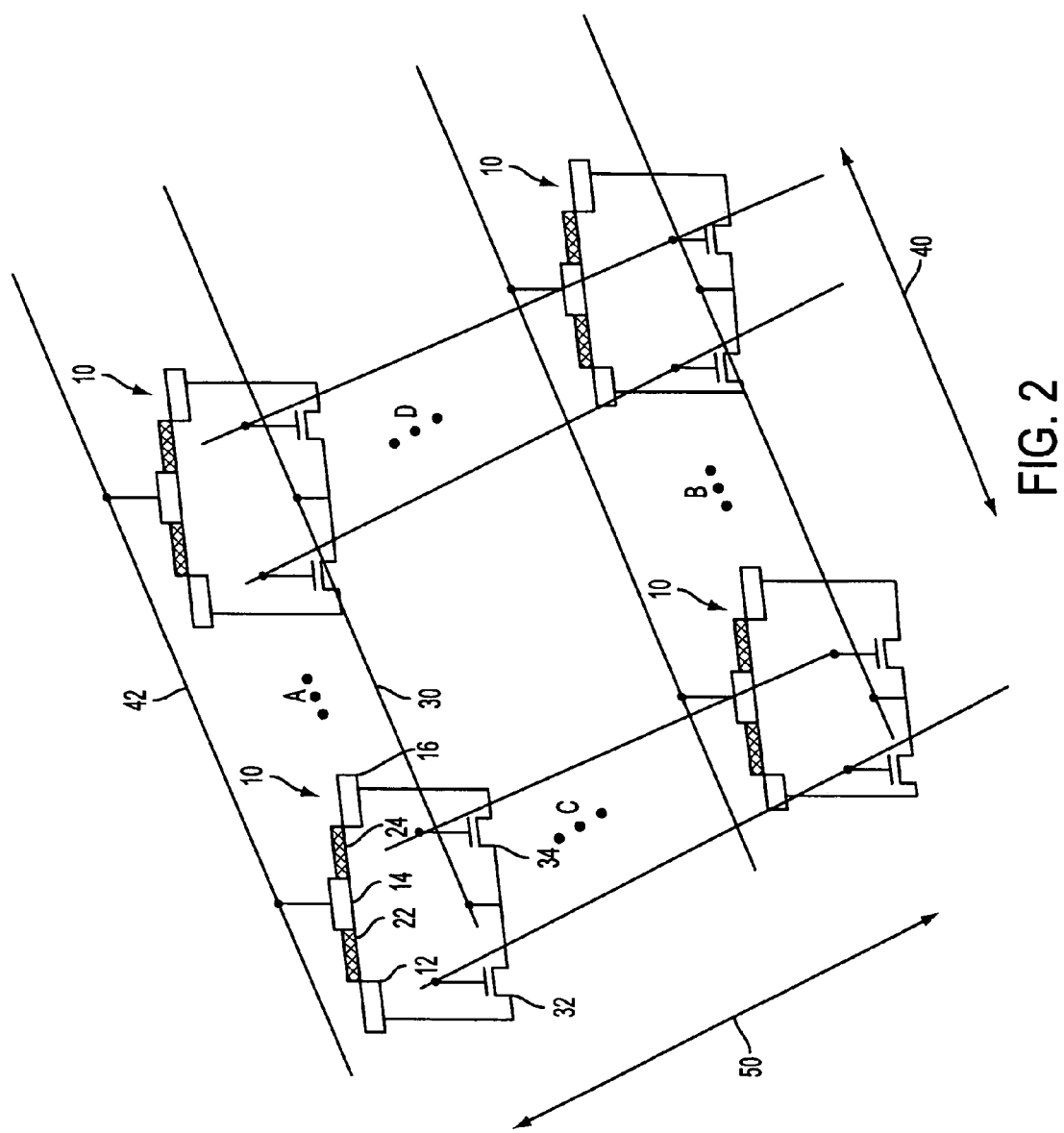
FIG. 2 is a portion of a memory array utilizing the dual memory architecture of FIG. 1.

In one embodiment of the invention, as shown in FIG. 2, a plurality of dual memory cells 10 are disposed in proximity to one another in, for example, a two-dimensional array of rows A, B and columns C, D. The bit line 30 is coupled to respective drains of the transistors 32, 34 of each cell 10 along a first dimension 40 of the array. The central electrodes 14 of each cell 10 are mutually coupled along the same first dimension 40 of the array by an electrode line 42. The gates of the first and second transistors 32, 34 are mutually coupled along a second dimension 50 of the array.

Figure 3:
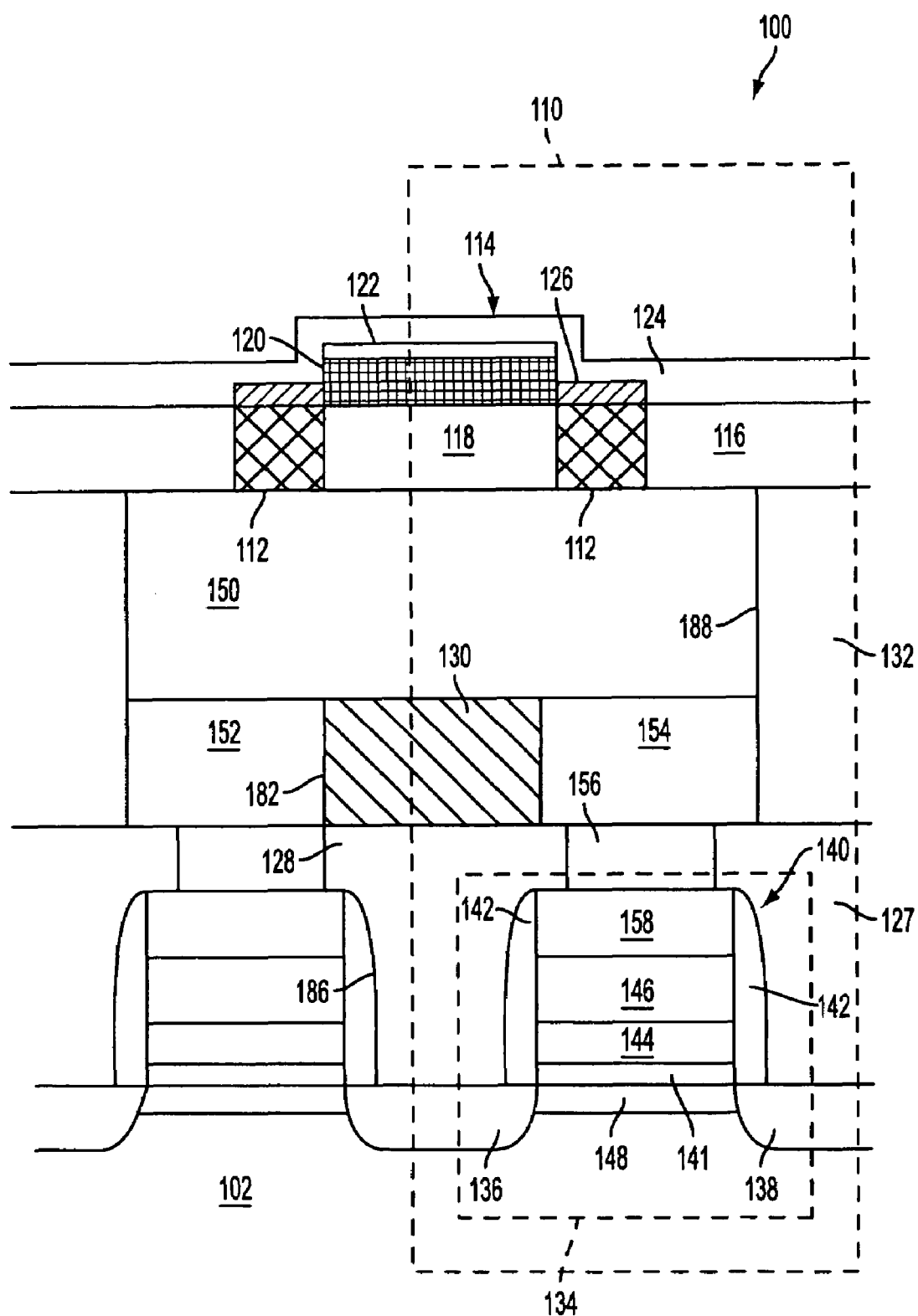
FIG. 3 is a cross-sectional view of an electronic memory cell in accordance with an exemplary embodiment of the invention.

FIG. 3 shows a portion of an integrated circuit memory device 100 according to an exemplary embodiment of the invention. A single cell of the memory integrated circuit device 100 is shown at 110. In one embodiment, the single cell 110 is one-half of a dual cell 10 as described in relation to FIG. 1. The memory cell 110 is formed over a semiconductor substrate 102. The memory cell 110 includes a region of insulating material 112 disposed between a first electrode structure 114 and a second electrode 116. The first electrode structure 114 includes a bottom electrode 118, a metal-containing region 120, and a top electrode 122.

Each cell 110 includes a memory element formed by a chalcogenide layer 124, e.g., a $Ge_{40}Se_{60}$ glass, adjacent to and in contact with a layer 120 of silver selenide $Ag_2Se$, the second electrode 116 in contact with a lower surface of the chalcogenide layer 124, the top electrode 122 in contact with an upper surface of the silver selenide layer 120, and the bottom electrode 118 in contact with a lower surface of silver selenide layer 120. The second and bottom electrodes 116, 118 are formed in trenches provided in an insulating layer 112.

Chalcogenide layer 124 is a top blanket layer for multiple memory cells (not shown). The silver selenide layer 120, top electrode 122 and bottom electrode 118 are formed as individual structures. The top electrode 122, silver selenide layer 120 and bottom electrode 118 are commonly shared by two memory elements defined between common top electrode 122, common silver selenide layer 120 and each of two different regions 126 of chalcogenide layer 124 between the silver selenide layer 120 and respective second electrodes 116 and 116.

According to one aspect of the invention, the bottom electrode 118 and top electrode 122 include polycrystalline silicon (polysilicon). According to one aspect of the invention, the metal-containing region 120 includes silver. The region of insulating material 112 allows the first electrode structure 114 and second electrode 116 to be maintained at differing electrical potentials when the memory cell is in a first state.

The layer of chalcogenic material 124 is disposed over the insulating material 112 including a region 126 between the first electrode structure 114 and second electrode 116. A region of variable-resistance material may be formed in region 126, depending upon various factors including an applied electrical potential between the first electrode structure 114 and the second electrode 116. Other factors in formation of the variable resistance material may include temperature. Formation of the variable-resistance material in region 126 may significantly alter a measurable resistance (and/or capacitance) between the first electrode structure 114 and second electrode 116.

The second electrode 116 is switchingly electrically coupled to a bit line 130 by a conductive plug 132, conductor 127, transistor 134 and conductor 128. The transistor 134 includes a source region 136, drain region 138 and a gate stack 140. The gate stack 140 includes insulating side regions 142 and one or more layers of conductive material 144. A word line 146 is electrically coupled to the gate stack 140 and controls the electrical conductivity of a channel region 148 below the gate stack 140. A layer of gate insulating material 141 separates the conductive material 144 from the channel region 148. The bit line 130 is spatially and electrically separated from the first electrode structure 114, second electrode 116, conductive plug 132 and the drain region 138 by one or more regions of insulating material 142, 150, 152, 154, 156 and 158.

As is discussed below, the voltage applied between the first electrode structure 114 and second electrode 116, for purposes of reading, writing, and erasing the cell 110, is controllable by applying appropriate electrical potentials to the first electrode structure 114, the bit line 130, and the word line 144. FIG. 3 shows additional features that are discussed below in more detail. These features include a trench 182 and vias 186, 188.

A plurality of memory cells arranged along the lines of memory cell 110, described above, may be advantageously formed on a single semiconductor substrate to form a memory integrated circuit device 100. Such a memory integrated circuit device provides a relatively high areal storage density due, at least in part, to the spatial arrangement of memory cell 110.

Figure 4:
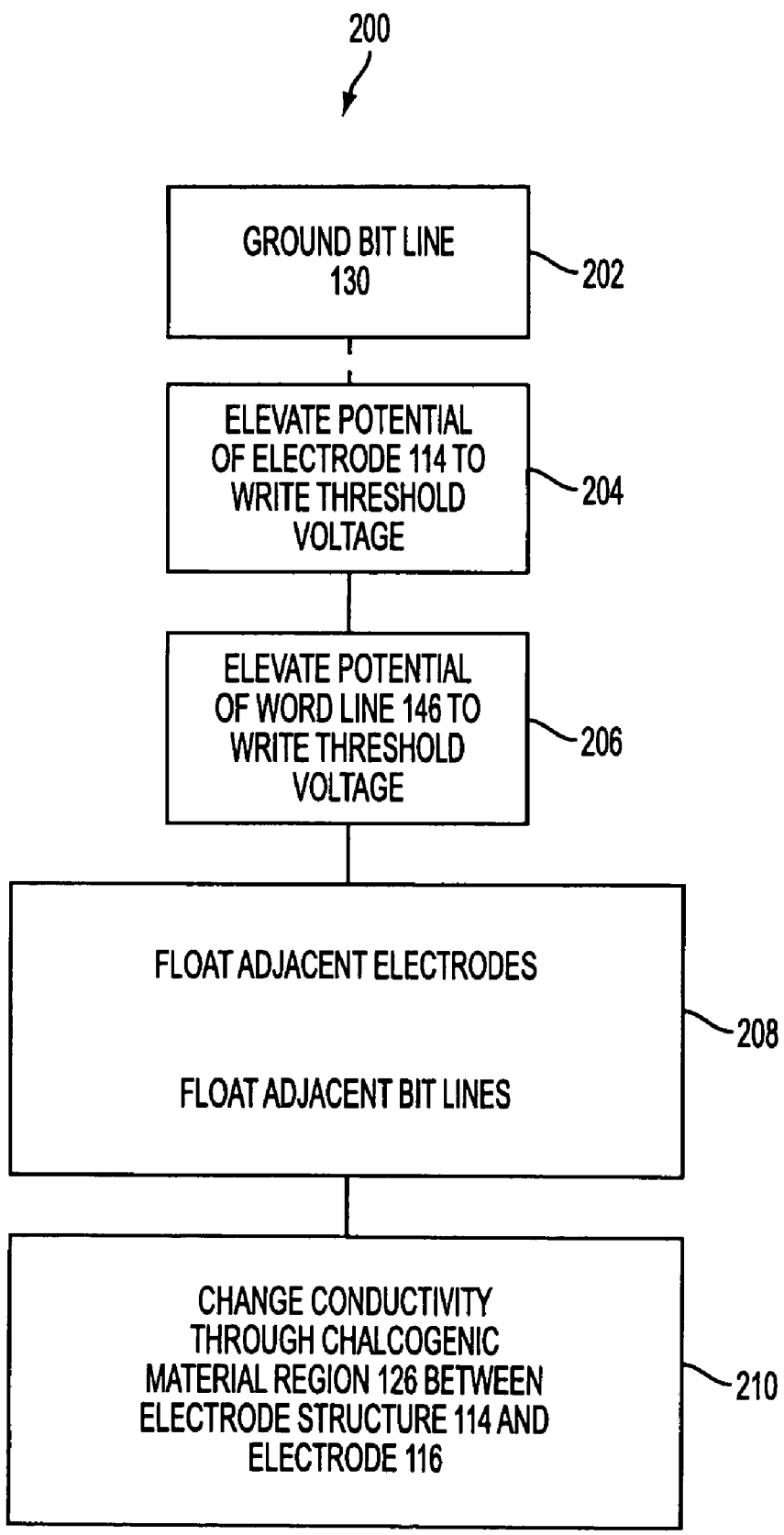
FIG. 4 is a flowchart showing an exemplary method of programming the memory cell of FIG. 3.

FIG. 4 shows a method 200 of writing to a cell 110 according to one aspect of the invention. In step 202, the bit line 130 is grounded. In step 204, the first electrode structure 114 is elevated to a potential of at least a write threshold voltage. The write threshold voltage is defined to be the voltage required to modify the conductivity of the chalcogenic region 126 plus at least the threshold voltage (Vth) of the access transistor 134. In step 206, the potential of the word line 146 is elevated to a write threshold voltage. Elevation of the word line voltage to the write threshold voltage activates the access transistor 134, causing channel region 148 to become conductive. In step 208, the conductors of a cell adjacent to the instant cell 110 are allowed to float. Accordingly, adjacent electrodes and bit lines are floated.

The consequence of the foregoing steps is that the grounded bit line 130 is switchingly coupled through conductor 128, transistor 134, conductor 127 and conductive polysilicon plug 132 to the second electrode 116, thereby grounding electrode 116. At the same time the first electrode structure 114 is raised to a potential of the write threshold voltage. A voltage differential equal to the write threshold voltage (less Vth of transistor 134), and associated electric field, therefore exists between the first electrode structure 114 and the second electrode 116.

This electric field acts upon the chalcogenic material in region 126. As a result, in step 210, the material in region 126 experiences a change in physical properties. For example, the conductivity and/or capacitance of chalcogenic material 124 may be changed. In one embodiment of the invention, this change in physical properties is an increase in conductivity (or decrease in resistance). Depending on a particular sensing scheme applied, such a change in conductivity may subsequently be sensed as a change in a measured voltage across, or current between, the first electrode structure 114 and second electrode 116.

Figure 5:
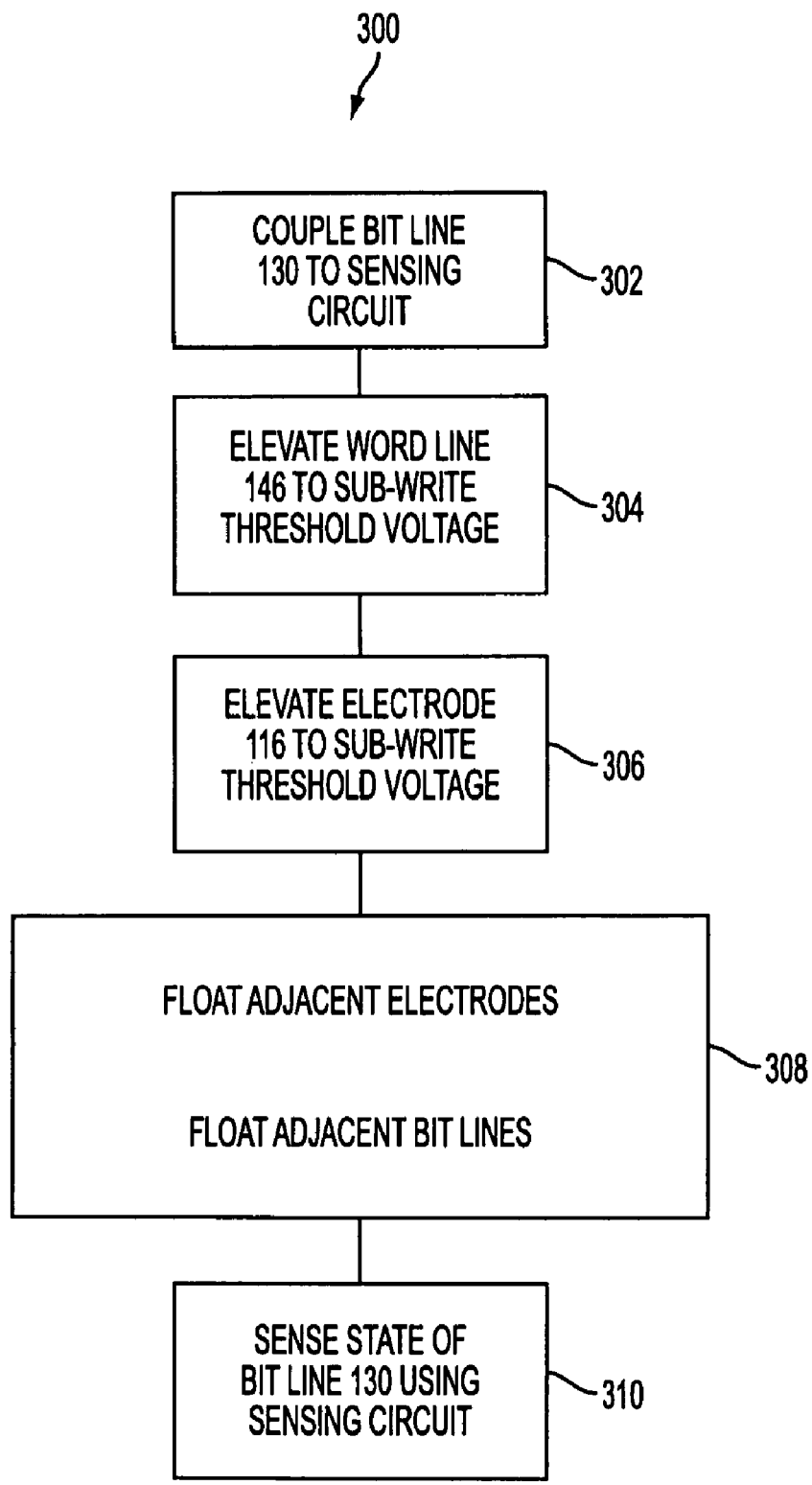
FIG. 5 is a flowchart showing an exemplary method of reading the memory cell of FIG. 3.

FIG. 5 shows a method 300 of reading a memory cell 110 according to one aspect of the invention. In step 302, the bit line 130 is coupled to a sensing circuit. In one embodiment, the sensing circuit provides a path switchingly coupling the bit line 130 to ground. In step 304, the word line 146 is coupled to a sub-write threshold voltage. The sub-write threshold voltage is a voltage less than the write threshold voltage i.e., a voltage above the threshold voltage Vth of transistor 134, but low enough so that it (or its resulting electric field) does not cause a substantial change in the conductivity of the chalcogenic material in region 126. Consequently, transistor 134 is activated and gate channel region 148 becomes conductive. In step 306 the first electrode structure 114 is elevated to the sub-write threshold voltage. At step 308, adjacent electrodes and bit lines are allowed to float. At step 310, the state of bit line 130 is sensed using the sensing circuit.

If the chalcogenic region 126 is in a relatively highly conductive state, a relatively large current will flow from the first electrode structure 114 through region 126 through the second electrode 116, polysilicon plug 132, conductor 127, transistor 134, and conductor 128 to the bit line 130. The bit line 130 will conduct this current to the sensing circuit, which will detect the relatively high conductivity of the chalcogenic region 126 as a first logical state of the cell 110. If, conversely, the chalcogenic region 126 is non-conductive or relatively highly resistive, the current through the above-described path will be relatively small. This relatively small current will also be detected by the sensing circuit as a second logical state of the cell 110.

Figure 6:
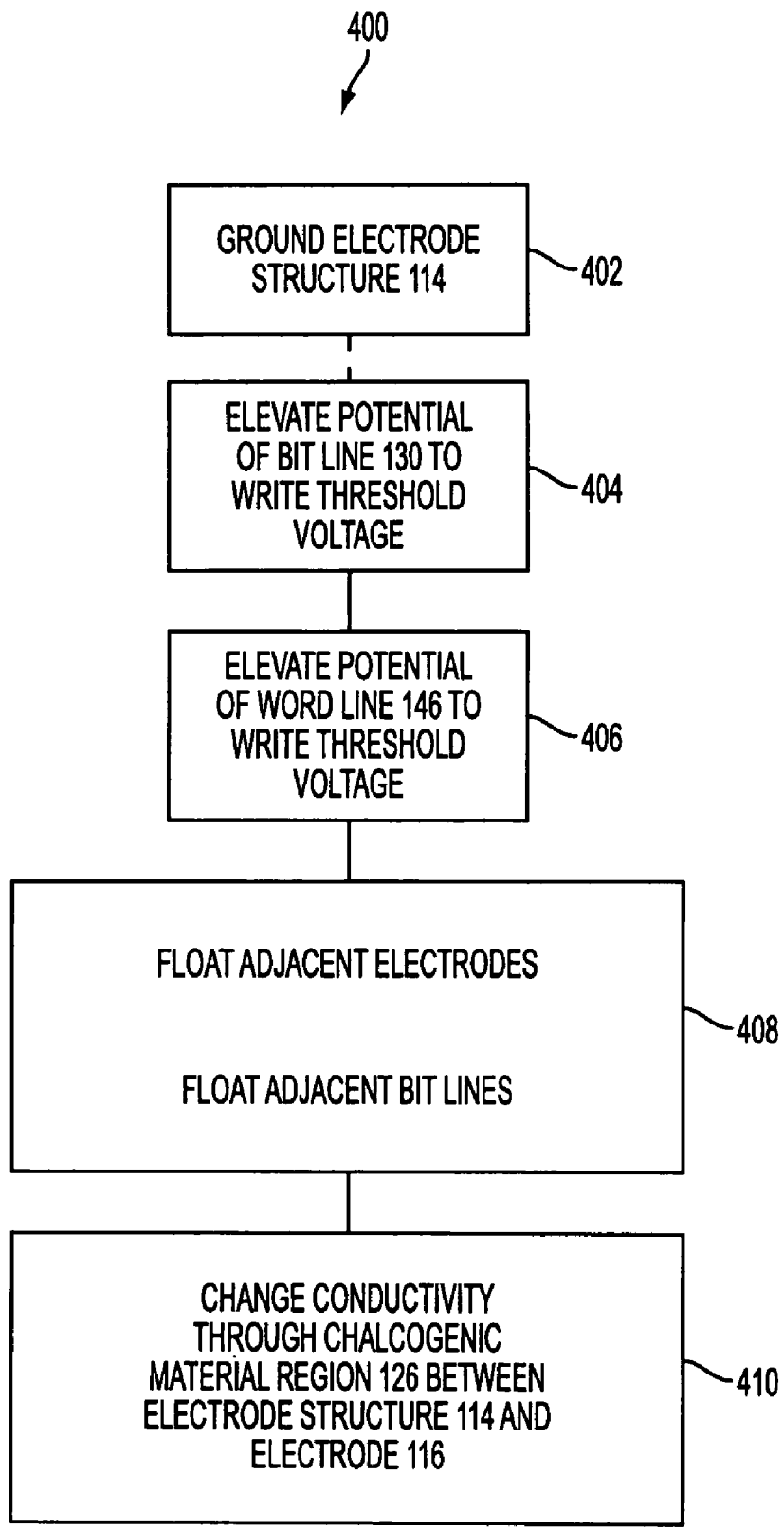
FIG. 6 is a flowchart showing an exemplary method of erasing the memory cell of FIG. 3.

FIG. 6 shows a method 400 of erasing cell 110 in accordance with an embodiment of the invention. In one embodiment, these steps correspond to the cell-writing steps of FIG. 4, except that the electrical polarity across region 126 is reversed. Accordingly, in step 402 the first electrode structure 114 is grounded. In step 404, the potential of the bit line 130 is elevated to write threshold voltage. In step 406, the potential of the word line 146 is elevated to write threshold voltage, activating the access transistor 134 and causing transistor gate region 148 to become conductive. In step 408, the conductors of adjacent cells, including adjacent electrodes and bit lines are allowed to float. In step 410, the conductivity through the chalcogenic material in region 126 experiences a change in conductivity. For example, the chalcogenic material may become less conductive, corresponding to erasure of the cell and an associated change in logical state. It should be noted that the physical property that changes in region 126 may be a property other than conductivity, depending on the particular embodiment of the invention; that is, the property may be optical reflectivity, optical transparency/translucency, magnetic permittivity or, electrical capacitance.

Figure 7A:
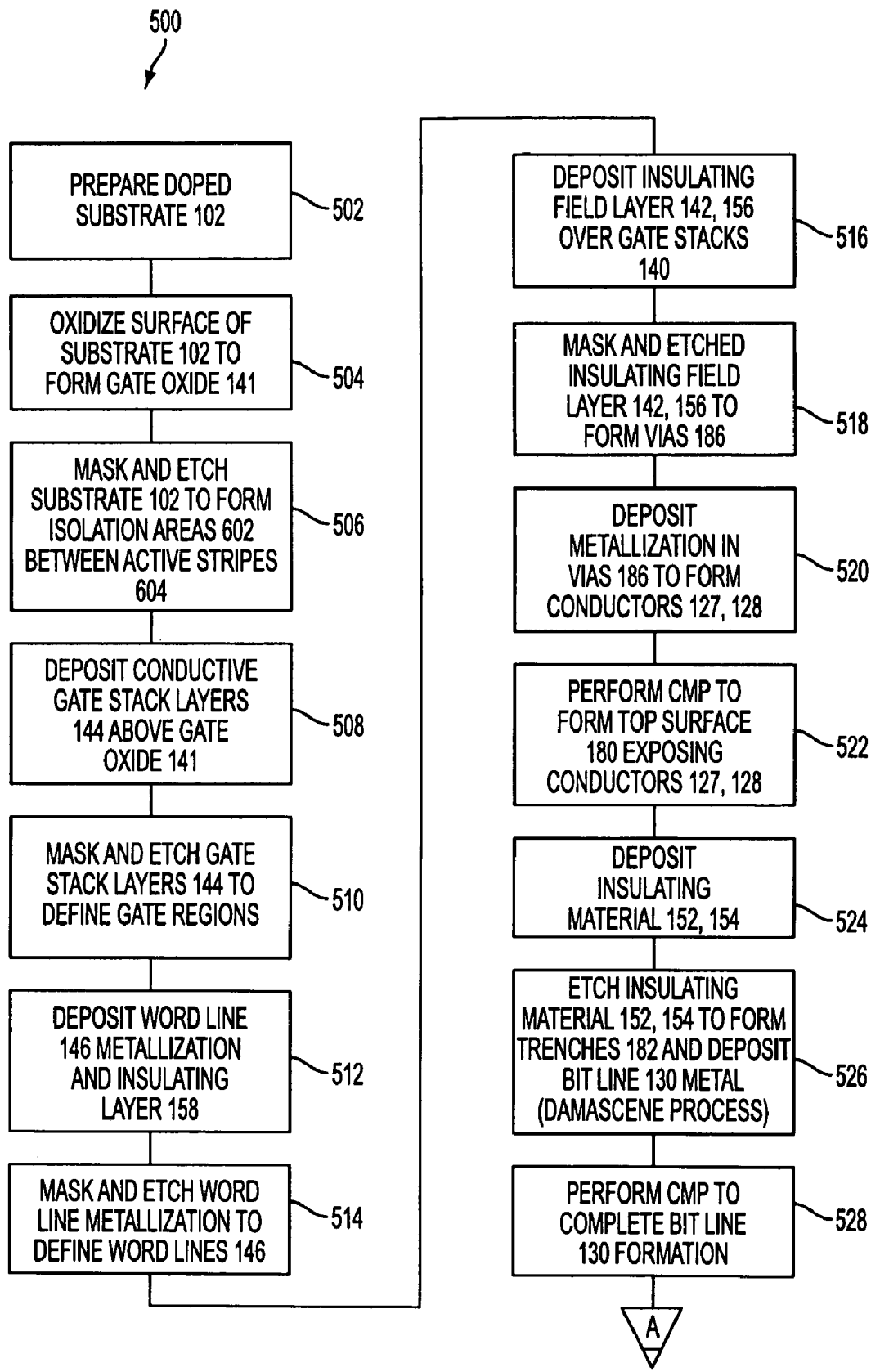
FIGS. 7A and 7B are flowcharts showing an exemplary method of manufacturing the memory cell of FIG. 3.
Figure 7B:
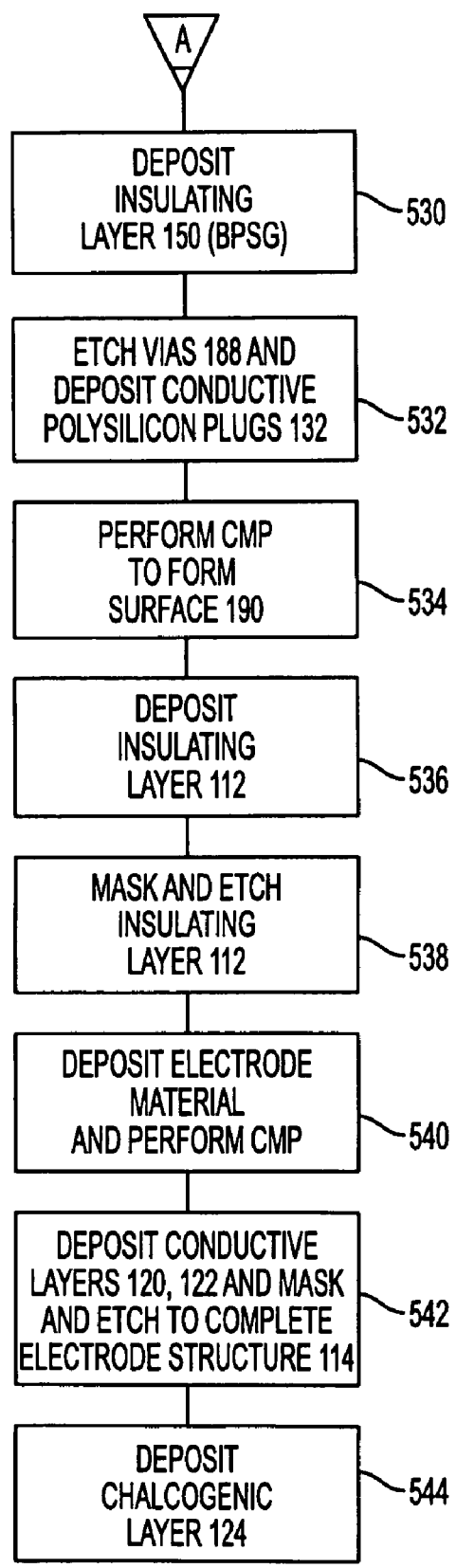

In one aspect of the invention, a semiconductor integrated circuit is formed including many memory cells 110 arranged in an array. FIGS. 7A–7B show a method 500 of forming the semiconductor integrated circuit according to one embodiment of the invention. The steps of FIGS. 7A–7B are also described with respect to in-process top views of an exemplary memory integrated circuit device 100, as shown in FIGS. 8–11.

Figure 8:
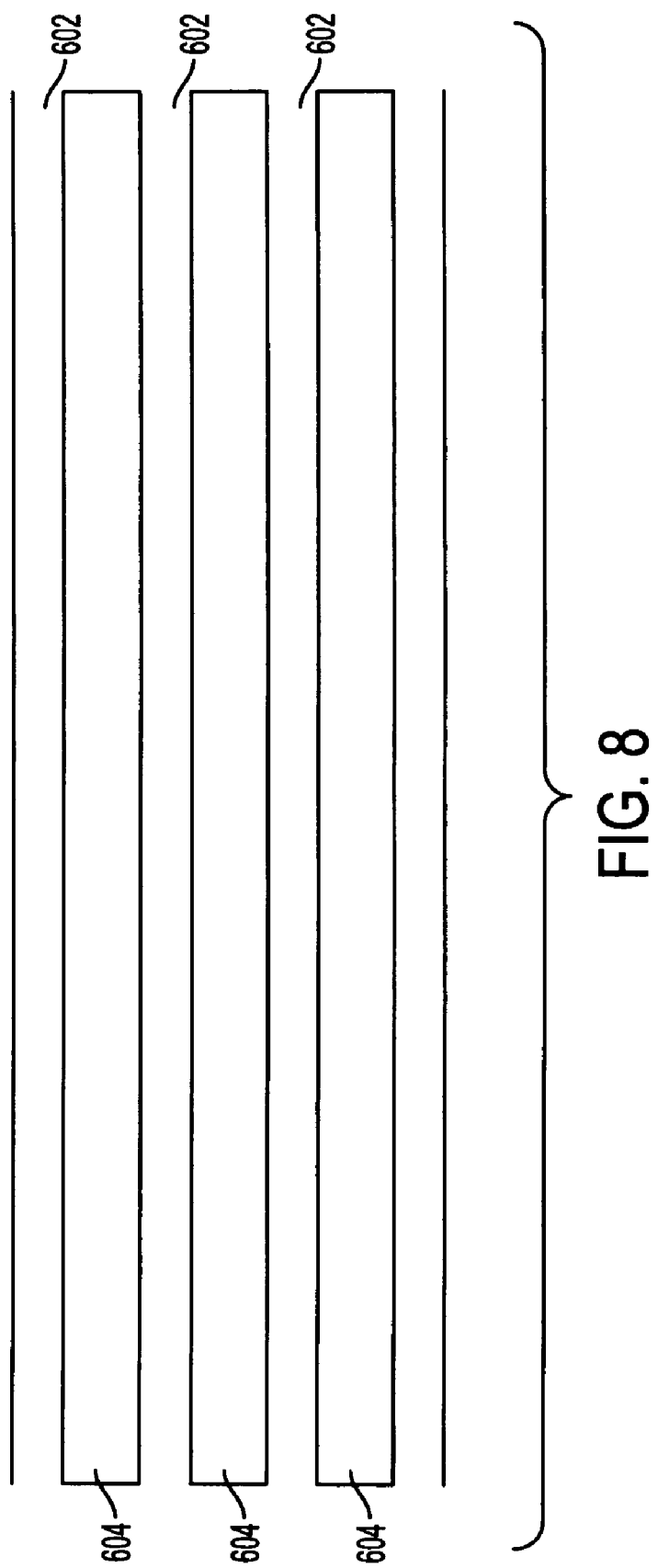
FIGS. 8–11 are diagrams showing the memory cell of FIG. 3 in various intermediate stages of fabrication in accordance with an embodiment of the invention.
Figure 9:
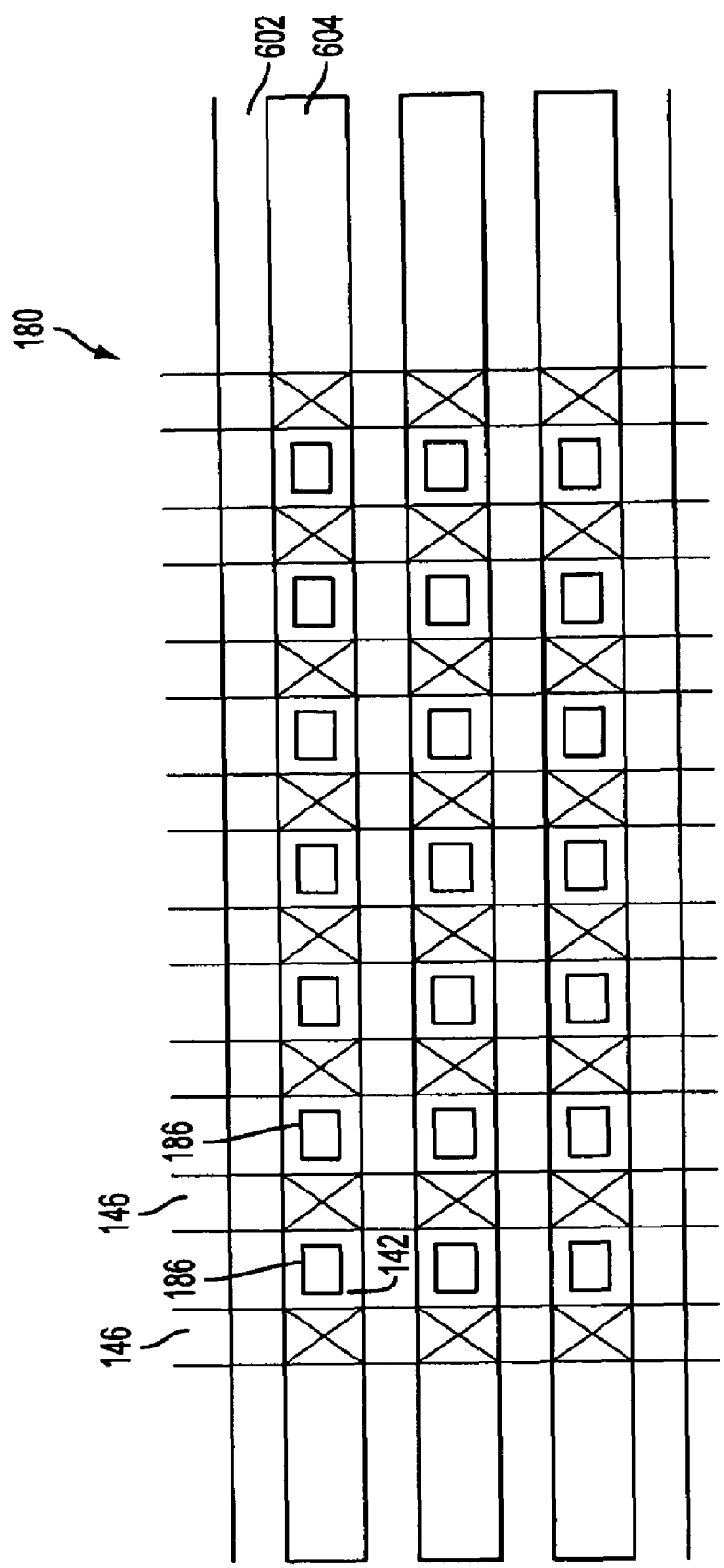

Referring to FIG. 7A, in step 502, a doped semiconductor substrate is provided. As discussed above, this substrate may be any conventional substrate. However, the inventor anticipates that the present invention may be applied with future substrates not yet known in the art. In step 504, an insulating layer is formed on an upper surface of the substrate. For example, the upper surface of the substrate may be oxidized to form gate oxide 141. In step 506 the oxide and substrate are masked and etched, or oxidized, to form isolation regions 602 (as shown in FIG. 8) and active areas 604. In step 508, conductive gate stack layers 144 are deposited above the gate oxide layer 141. In step 510, a mask is applied and excess gate stack layer material is removed to define gate regions. In step 512 a layer of conductive material (for word lines 146) is deposited, topped by a layer of insulating material 158. In step 514, a mask layer is applied above the conductive material and insulating material, and an etchant is applied to remove excess material and define word lines 146, topped by insulating material 158, thereby completing the conductive portion of the gate stack 140. In step 516 an insulating field layer 142, 156 is deposited over the gate stacks 140.

Figure 10:
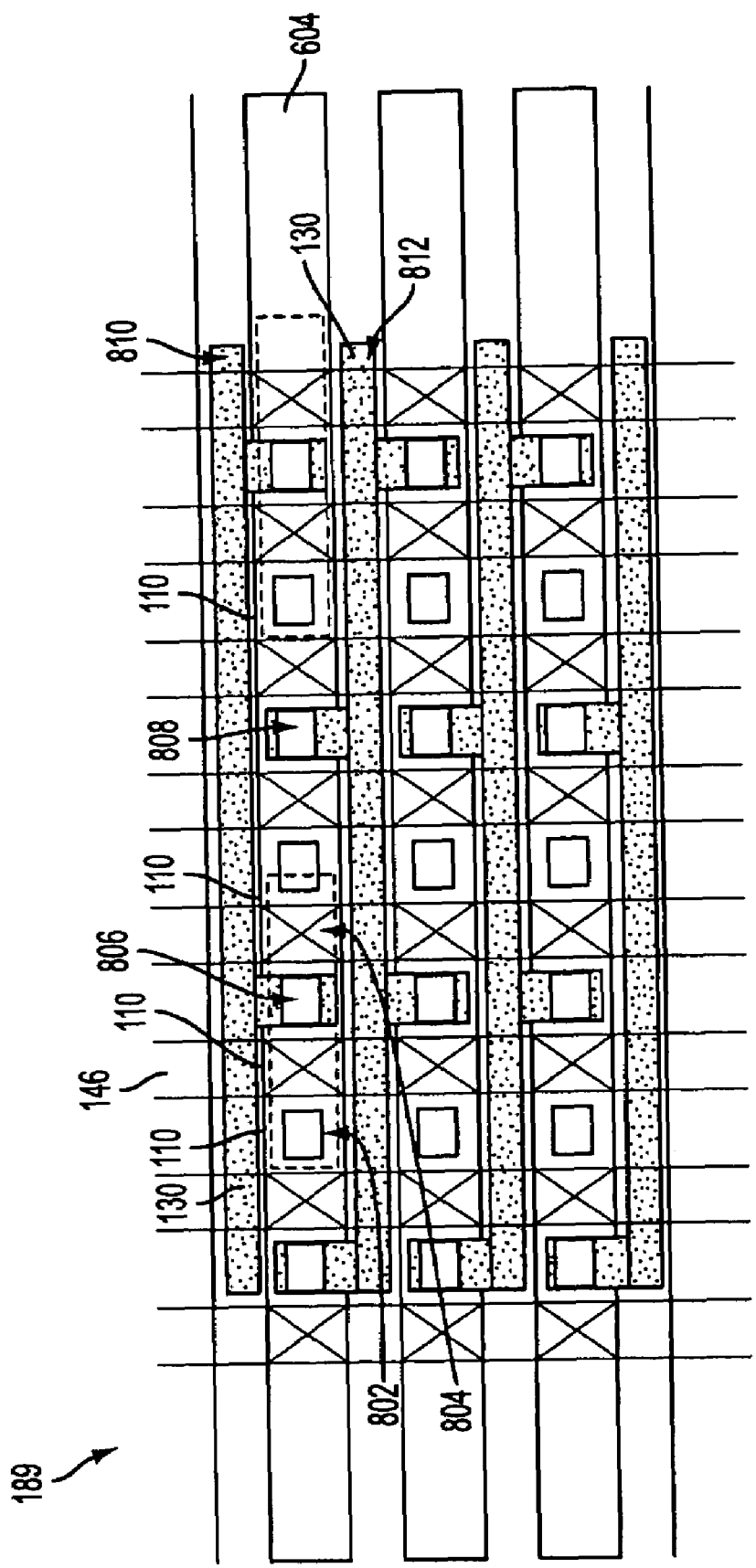

In step 518 vias 186 (shown in FIG. 9) are etched into the insulating field layer 142, 156 exposing source 136 and drain 138 regions in the active areas 604 (FIG. 8). In step 520, metal is deposited into the vias 186 to form conductors 127, 128. In step 522, chemical mechanical planarization (CMP) is performed to yield a substantially flat surface 180. In step 524, insulating material 152, 154 is deposited in a layer above the surface 180. In step 526, in a Damascene process, trenches 182 (as seen in FIG. 3) are etched in the insulating material 152, 154. Metal for the bit lines 130 is deposited within the trenches 182. The trenches 182 are etched and bit lines 130 are deposited in contact with conductors 128. In step 528, CMP is performed to complete bit line formation. The CMP process produces surface 189. An exemplary top view of the resulting bit lines is shown in FIG. 10. Note that, according to the embodiment of the invention shown in FIG. 10, a single bit line 130 services two adjacent cells (at 802, 804) at one conductor 128 within a single active area 604. Sequential conductors 128 (at 806, 808), however, are serviced by other bit lines (at 810, 812).

Referring FIG. 7B, in step 530, a layer of insulating material 150 is deposited over the surface 189. In one exemplary embodiment, insulating material 150 includes borophosphosilicate glass (BPSG). In step 532, vias 188 are etched through the insulating material 150, 152, 154 to expose the tops of conductors 127. Conductive material, such as polysilicon, is deposited within the vias 188 to form conductive plugs 132.

Figure 11:
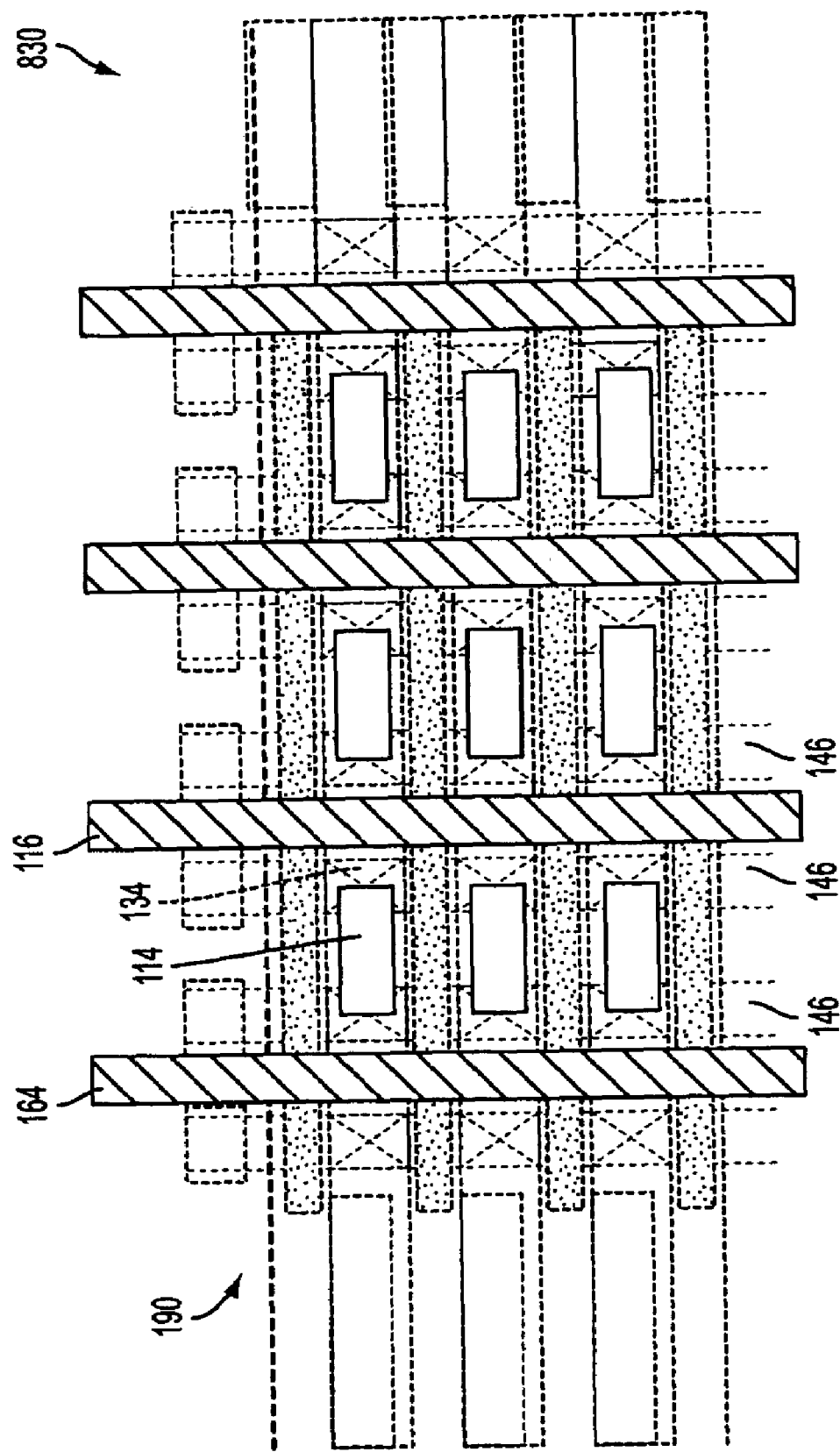

In step 534 CMP is performed to remove excess conductive material and form surface 190 (FIG. 11). In step 536 a layer of insulating material 112 is deposited over surface 190. In step 538, a mask is applied over this insulating material 112, and the insulating material 112 is patterned by etching or equivalent techniques. In step 540, conductive material is deposited and CMP is performed to form electrodes 118. Thereafter, in step 542 conductive layers 128, 122 are deposited, masked and etched, to complete the first electrode structure 114 according to the illustrated embodiment of the invention.

FIG. 11 shows a top view of a portion of an array of memory cells 830 at this stage in the process. The first electrode structure 114 is disposed between adjacent electrodes 116, 164. Word lines 146 and access transistors 134 are also illustrated.

Referring again to FIG. 7B, in step 544 a layer of chalcogenic material 124 is deposited over the electrodes, insulating layer and the first electrode structures. Additional processing, such as passivation and the application of encapsulating layers may be performed, as would be understood by one of skill in the art.

Figure 12:
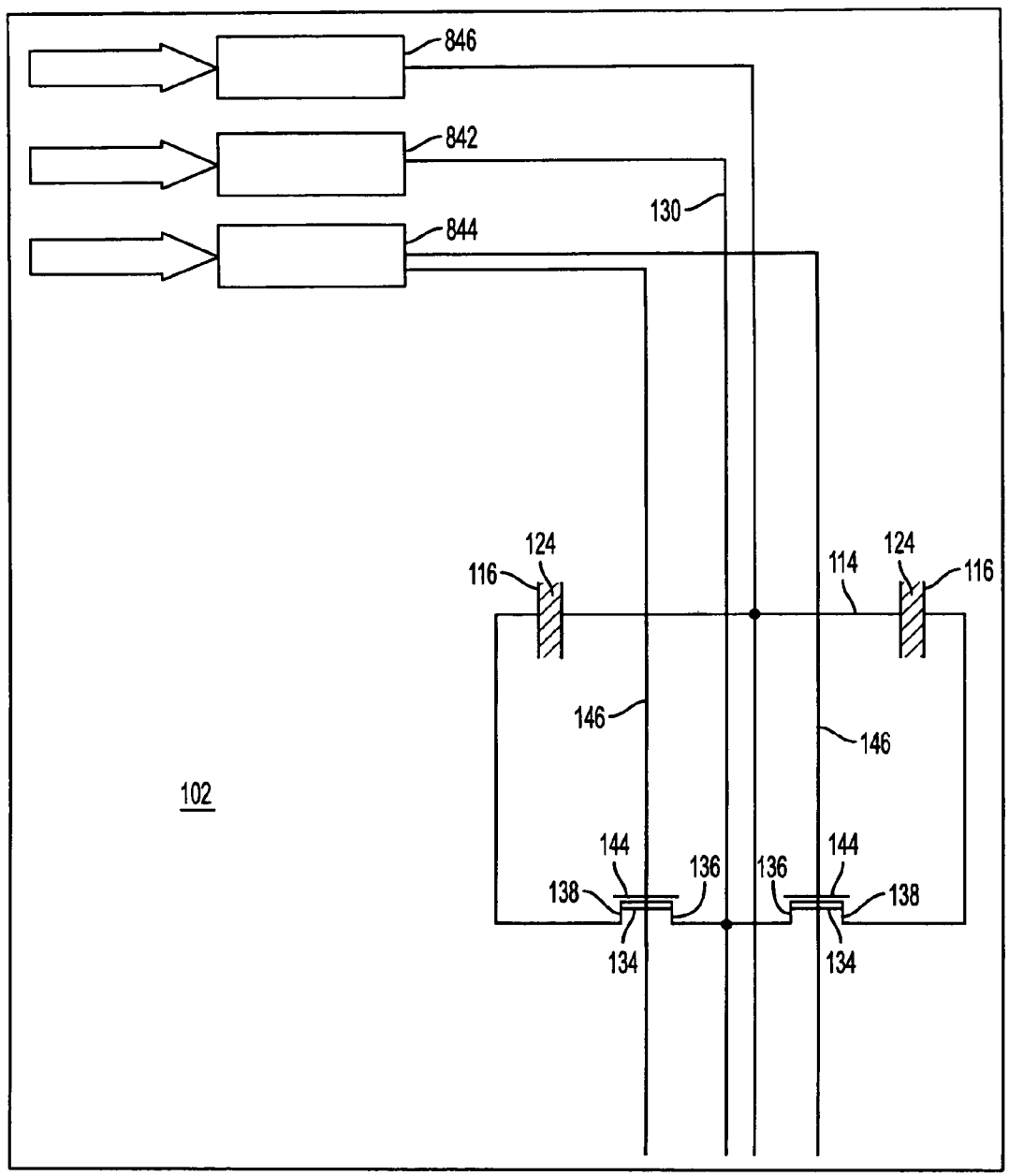
FIG. 12 is a diagram showing an electronic memory device in block diagram form according to one aspect of the invention.

FIG. 12 illustrates an electronic memory device in block diagram form according to one aspect of the invention. Access transistors 134 are disposed on a substrate 102. The transistors 134 each include a respective drain 136. The drains 136 are mutually coupled to a bit line 130. The bit line 130 is activated by a bit line decoder 842. The transistors 134 also include a respective source 138. Each source 138 is coupled to a respective electrode 116. Each transistor 134 also include a respective gate 144 coupled to a respective word line 146. The word lines 146 are selectively activated by a word line decoder 844. A first electrode structure 114 is disposed between, and in spaced relation to, the second electrodes 116. The first electrode structure 114 is activated by an electrode decoder 846. Between the first electrode structure 114 and each second electrode 116 is disposed variable resistance material (not shown).

Figure 13:
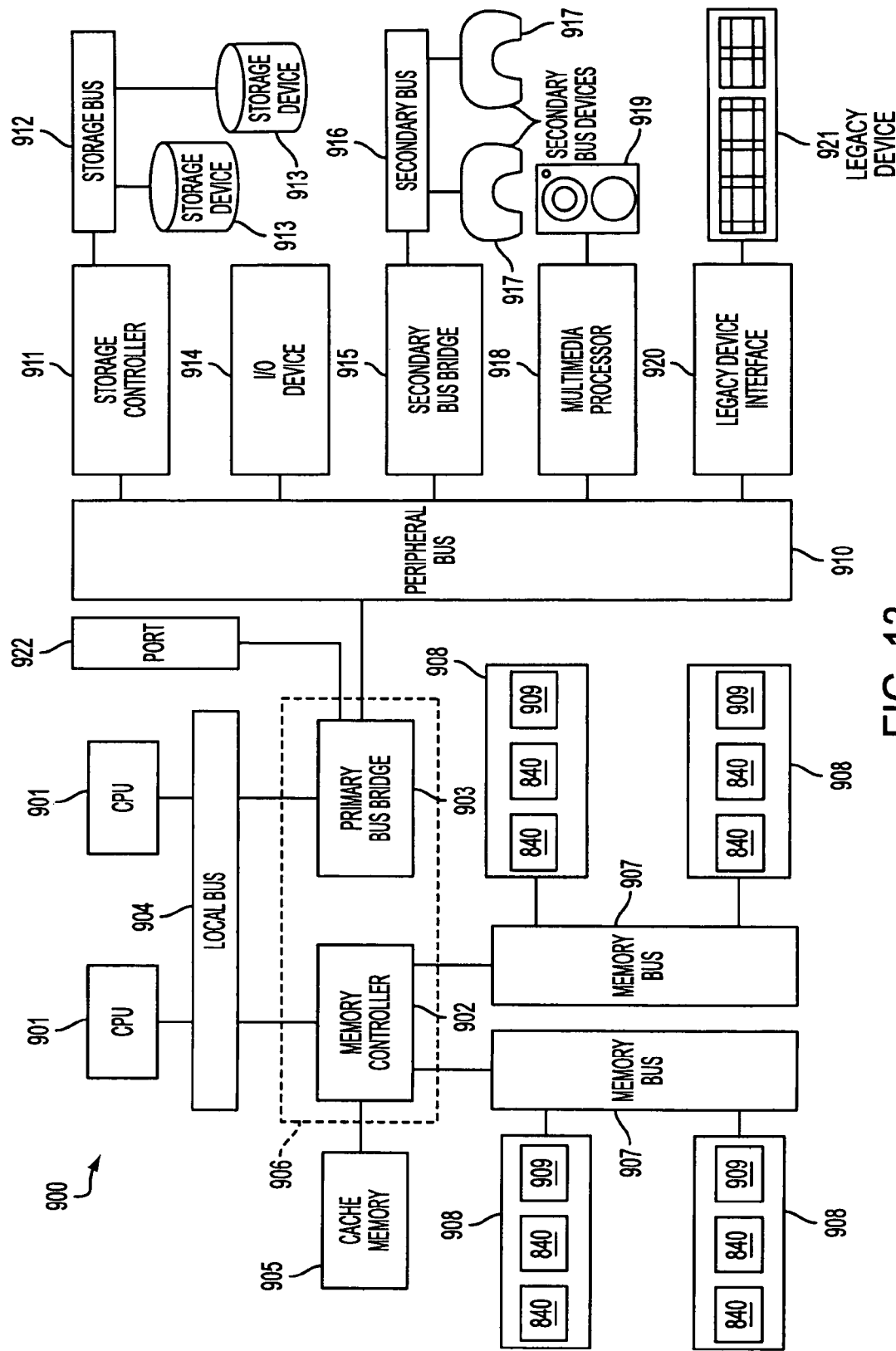
FIG. 13 is a block diagram showing an electronic system in block diagram form according to one aspect of the invention.

FIG. 13 illustrates an exemplary processing system 900 that utilizes a resistance variable memory random access device 840 containing an array 830 of resistance variable memory cells 100 constructed as described above with reference to FIGS. 1–12. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908, which include at least one memory device 840 of the invention. Alternatively, in a simplified system, the memory controller 902 may be omitted and the memory components directly coupled to one or more processors 901. The memory components 908 may be a memory card or a memory module. The memory components 908 may include one or more additional devices 909. For example, the additional device 909 might be a configuration memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 13 is only an exemplary processing system with which the invention may be used. While FIG. 13 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory elements 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The description and drawings presented above illustrate only a few of the many embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A memory device comprising:
    a bit line disposed at a first level above a substrate;
    a switching device disposed to second level above the substrate and below said first level, said switching device coupled to said bit line, said switching device being adapted to control a signal received from said bit line; and
    a variable-state electronic device disposed at a third level above said first level, said variable-state electronic device electrically coupled to said switching device to switchingly receive said signal therefrom.

2. The memory device of claim 1, wherein said switching device comprises a transistor.

3. The memory device of claim 2 further comprising a word line coupled to a gate of said transistor.

4. The memory device of claim 1, wherein said variable-state electronic device comprises a variable-conductivity memory cell.

5. The memory device of claim 1, wherein said variable-state electronic device comprises a variable-capacitance memory cell.

6. The memory device of claim 1, wherein said variable-state electronic device comprises a layer of chalcogenide material.

7. The memory device of claim 1, wherein said variable-state electronic device comprises:
    a first electrode coupled to said switching device;
    a second electrode disposed in spaced relation to said first electrode; and
    a chalcogenic material disposed in a region between said first and second electrodes.

8. The memory device of claim 7, wherein said second electrode comprises a metallic material, said metallic material being adapted to release ions thereof into said chalcogenic material to produce a changed physical property of said chalcogenic material.

9. The memory device of claim 8, wherein said metallic material comprises tungsten.

10. The memory device of claim 8, wherein said metallic material comprises silver.

11. The memory device of claim 8, wherein said changed physical property comprises change conductivity.

12. The memory device of claim 8, wherein said changed physical property comprises changed optical reflectivity.

13. The memory device of claim 8, wherein said changed physical property comprises changed electrical capacitance.

14. The memory device of claim 1 further comprising a decoder circuit supported by said substrate, said decoder circuit adapted to control said switching device.

15. A memory device comprising:
    a first electrode including a source of metal ions;
    a second electrode disposed in spaced relation to said first electrode;
    a resistance variable material disposed between said first electrode and said second electrode; and
    switching means disposed below said first and second electrodes, said switching means adapted to couple said second electrode to a signal line disposed below said first and second electrodes.

16. The memory device of claim 15, wherein said switching means includes a transistor and wherein said transistor is adapted to be controlled by a word line disposed beneath said first and second electrodes.

17. The memory device of claim 15, wherein said signal line comprises a bit line.

18. An electronic device comprising:
    a transistor having a first and second controlled terminal regions and a gate;
    first and second conductors disposed above and electrically coupled to said first and second controlled terminal regions respectively;
    a first signal line disposed above and coupled to said first conductor;
    a first electrode disposed above and coupled to said second conductor;

a second electrode disposed in spaced relation to said first electrode; and a region of material adapted to exhibit a changed physical property in response to a voltage applied between said first and second electrodes.

19. The electronic device of claim 18, wherein said region of material comprises a chalcogenic variable resistance material.

20. The electronic device of claim 18, wherein said second electrode comprises silver.

21. A memory device comprising:

a transistor coupled between a bit line and a first electrode;

a second electrode disposed in spaced relation to said first electrode and separated therefrom by an insulating region, said first and second electrodes being disposed above said transistor; and a region of variable resistance material disposed between said first and second electrodes.

22. An integrated circuit memory device comprising:

an electrode structure disposed above a bit line and separated therefrom by a substantially non-conductive region;

first and second transistors electrically coupled to said bit line, said first and second transistors being adapted to switchingly electrically couple said bit line to second and third electrodes respectively, said second and third electrodes being disposed in spaced relation to one another and to said first electrode; and a layer of variable resistance material disposed in a first region between said first and second electrodes and in a second region between said first and third electrodes.

23. The integrated circuit memory device of claim 22, wherein said third electrode is disposed between said first and second electrodes.

24. The integrated circuit memory device of claim 22, wherein said substantially nonconductive region comprises an insulating material.

25. The integrated circuit memory device of claim 24, wherein said insulating material comprises silicon nitride.

26. The integrated circuit memory device of claim 24, wherein said insulating material comprises silicon dioxide.

27. An integrated circuit memory device comprising:

electrode structure disposed above a bit line and separated therefrom by a region of insulating material;

first and second transistors electrically coupled to said bit line, said first and second transistors being adapted to switchingly electrically couple said bit line to second and third electrodes respectively, said second and third electrodes being disposed in spaced relation to one another and to said first electrode;

a layer of variable resistance material disposed in a first region between said first and second electrodes and in a second region between said first and third electrodes;

a word line decoder, said word line decoder being electrically coupled to respective gates of said first and second transistors;

a bit line decoder, said bit line decoder being electrically coupled to said bit line; and electrode decoder, said electrode decoder being electrically coupled to said first electrode.

* * * * *

UNITED STATES PATENT AND TRADEMARK OFFICE
CERTIFICATE OF CORRECTION

PATENT NO.        : 7,050,319 B2
APPLICATION NO.   : 10/725557
DATED             : May 23, 2006
INVENTOR(S)       : John T. Moore et al.

It is certified that error appears in the above-identified patent and that said Letters Patent is hereby corrected as shown below:

In the Specification, the following errors are corrected:

Column 7, line 51, "Referring FIG. 7B" should read --Referring to FIG. 7B--;

Column 8, line 23, "include" should read --includes--;

Column 8, line 38, "coupled the" should read --coupled to the--;

Column 9, line 4, "an legacy" should read --a legacy--;

Column 9, line 5, "also coupled" should read --also be coupled--;

Column 9, line 15, "an local" should read --a local--;

Column 9, line 19, "an universal" should read --a universal--;

Column 9, line 23, "to one additional" should read --to additional--; and

Column 9, line 41, "system" should read --systems--.

In the Other Publications portion of the References Cited section, the following error is corrected:

"West, W.C.; Sieradski, K.; Kardynal, B.; Kozicki, M.N., Equivalent circle modeling of the Ag?As$_{0.24}$ S$_{0.36}$Ag$_{0.40}$?Ag System prepared by photodissolution of Ag, J. Electrochem. Soc. 145 (1998) 2971-2974."

UNITED STATES PATENT AND TRADEMARK OFFICE
CERTIFICATE OF CORRECTION

| | |
|---|---|
| PATENT NO. | : 7,050,319 B2 |
| APPLICATION NO. | : 10/725557 |
| DATED | : May 23, 2006 |
| INVENTOR(S) | : John T. Moore et al. |

It is certified that error appears in the above-identified patent and that said Letters Patent is hereby corrected as shown below:

Should read

--West, W.C.; Sieradski, K.; Kardynal, B.; Kozicki, M.N., Equivalent circle modeling of the Ag|As$_{0.24}$S$_{0.36}$Ag$_{0.40}$|Ag System prepared by photodissolution of Ag, J. Electrochem. Soc. 145 (1998) 2971-2974.--.

Signed and Sealed this

Fifteenth Day of August, 2006

JON W. DUDAS
*Director of the United States Patent and Trademark Office*